United States Patent
Shin et al.

(10) Patent No.: US 10,686,083 B2
(45) Date of Patent: Jun. 16, 2020

(54) METHOD OF MANUFACTURING FINGER ELECTRODE FOR SOLAR CELL AND FINGER ELECTRODE FOR SOLAR CELL MANUFACTURED THEREBY

(71) Applicant: SAMSUNG SDI CO., LTD., Yongin-si, Gyeonggi-do (KR)

(72) Inventors: Dong Il Shin, Suwon-si (KR); Seok Hyun Jung, Suwon-si (KR)

(73) Assignee: Samsung SDI Co., Ltd., Yongin-si, Gyeonggi-do (KR)

( * ) Notice: Subject to any disclaimer, the term of this patent is extended or adjusted under 35 U.S.C. 154(b) by 82 days.

(21) Appl. No.: 15/698,873

(22) Filed: Sep. 8, 2017

(65) Prior Publication Data

US 2018/0226519 A1    Aug. 9, 2018

(30) Foreign Application Priority Data

Feb. 3, 2017   (KR) .......................... 10-2017-0015803

(51) Int. Cl.
*H01L 31/18*   (2006.01)
*H01L 31/0224*   (2006.01)
*H01B 1/22*   (2006.01)

(52) U.S. Cl.
CPC ....... *H01L 31/022425* (2013.01); *H01B 1/22* (2013.01); *H01L 31/022433* (2013.01); *H01L 31/1884* (2013.01); *Y02P 70/521* (2015.11)

(58) Field of Classification Search
CPC ..... H01L 31/022425; H01L 31/022433; H01L 31/1884; H01B 1/22; Y02P 70/521
See application file for complete search history.

(56) References Cited

U.S. PATENT DOCUMENTS

2013/0316492 A1* 11/2013 Ushifusa ................ B41F 15/40
                                                      438/98
2015/0333197 A1* 11/2015 Takeda ..................... H01B 1/22
                                                     136/256

FOREIGN PATENT DOCUMENTS

| JP | 4255248 B2 | 4/2009 |
|----|------------|--------|
| KR | 10-1340554 B1 | 1/2014 |
| KR | 10-2014-0127947 A | 11/2014 |
| TW | 2014-18041 A | 5/2014 |
| TW | 2014-31100 A | 8/2014 |
| WO | WO 2015/104793 A1 | 7/2015 |

OTHER PUBLICATIONS

Korean Office Action dated Dec. 20, 2018 in the corresponding Korean Patent Application No. 10-2017-0015803.
Taiwanese Office Action dated Jul. 20, 2018.

* cited by examiner

*Primary Examiner* — Timor Karimy
(74) *Attorney, Agent, or Firm* — Lee IP Law, PC

(57) ABSTRACT

A method of manufacturing a finger electrode for a solar cell includes printing a conductive paste on a front surface of a substrate using a printing mask having an opening rate of 65% or more, and baking the printed conductive paste. The conductive paste may include a conductive powder, a glass frit, and an organic vehicle, and the conductive powder may include a first conductive powder having a particle diameter (D50) of about 0.1 μm to about 1.5 μm and a second conductive powder having a particle diameter (D50) of greater than 1.5 μm to about 5 μm, and the conductive powder as a whole has a particle diameter (D10) of about 0.5 μm or less.

13 Claims, 3 Drawing Sheets

Longitudinal direction

Place printing mask on a front surface of semiconductor substrate.

Place a conductive paste on the printing mask, and then print conductive paste on the front surface of the semiconductor substrate using a squeegee and dry.

Print an aluminum paste on a back surface of the semiconductor substrate and dry.

Bake.

METHOD OF MANUFACTURING FINGER ELECTRODE FOR SOLAR CELL AND FINGER ELECTRODE FOR SOLAR CELL MANUFACTURED THEREBY

CROSS-REFERENCE TO RELATED APPLICATION

Korean Patent Application 10-2017-0015803, filed on Feb. 3, 2017 in the Korean Intellectual Property Office, and entitled: "Method of Manufacturing Finger Electrode for Solar Cell and Finger Electrode for Solar Cell Manufactured Thereby," is incorporated by reference herein in its entirety.

BACKGROUND

1. Field

Embodiments relate to a method of manufacturing a finger electrode for a solar cell and a finger electrode for a solar cell manufactured thereby.

2. Description of the Related Art

Solar cells generate electricity using the photovoltaic effect of a p-n junction which converts photons of sunlight into electricity. In the solar cell, front and rear electrodes are respectively formed on upper and lower surfaces of a semiconductor wafer or substrate with the p-n junctions therebetween. Then, the photovoltaic effect at the p-n junction is induced by sunlight entering the semiconductor wafer and electrons generated by the photovoltaic effect at the p-n junction provide electric current through the electrodes.

SUMMARY

Embodiments are directed to a method of manufacturing a finger electrode for a solar cell, the method including printing a conductive paste on a front surface of a substrate using a printing mask having an opening rate of 65% or more, and baking the printed conductive paste. The conductive paste may include a conductive powder, a glass frit, and an organic vehicle, and the conductive powder may include a first conductive powder having a particle diameter (D50) of about 0.1 μm to about 1.5 μm and a second conductive powder having a particle diameter (D50) of greater than 1.5 μm to about 5 μm, and the conductive powder as a whole has a particle diameter (D10) of about 0.5 μm or less.

The conductive powder as a whole may have a particle diameter (D10) of about 0.1 μm to about 0.2 μm.

A weight ratio of the first conductive powder to the second conductive powder may range from about 1:99 to about 99:1.

The printing mask may have an opening rate of about 65% to about 90%.

The printing mask may include a mesh, a photosensitive resin layer integrated with the mesh, and an electrode printing portion formed by removing the photosensitive resin layer.

Baking of the conductive paste may be performed at about 600° C. to about 1,000° C.

The glass frit may include at least one of lead (Pb), bismuth (Bi), tellurium (Te), phosphorus (P), germanium (Ge), gallium (Ga), cerium (Ce), iron (Fe), lithium (Li), boron (B), silicon (Si), zinc (Zn), tungsten (W), magnesium (Mg), cesium (Cs), strontium (Sr), molybdenum (Mo), titanium (Ti), tin (Sn), indium (In), vanadium (V), barium (Ba), nickel (Ni), copper (Cu), sodium (Na), potassium (K), arsenic (As), cobalt (Co), zirconium (Zr), manganese (Mn), and aluminum (Al) oxides.

The conductive paste may include about 60 wt % to about 95 wt % of the conductive powder, about 0.5 wt % to about 20 wt % of the glass frit, and about 1 wt % to about 30 wt % of the organic vehicle.

The conductive paste may further include at least one additive of a dispersant, a thixotropic agent, a plasticizer, a viscosity stabilizer, an anti-foaming agent, a pigment, a UV stabilizer, an antioxidant, and a coupling agent.

Embodiments are also directed to a finger electrode for a solar cell manufactured by the method according to an embodiment.

Embodiments are also directed to a solar cell including a finger electrode manufactured by the method according to an embodiment.

BRIEF DESCRIPTION OF DRAWINGS

Features will become apparent to those of skill in the art by describing in detail exemplary embodiments with reference to the attached drawings in which.

DETAILED DESCRIPTION

Figure 1:
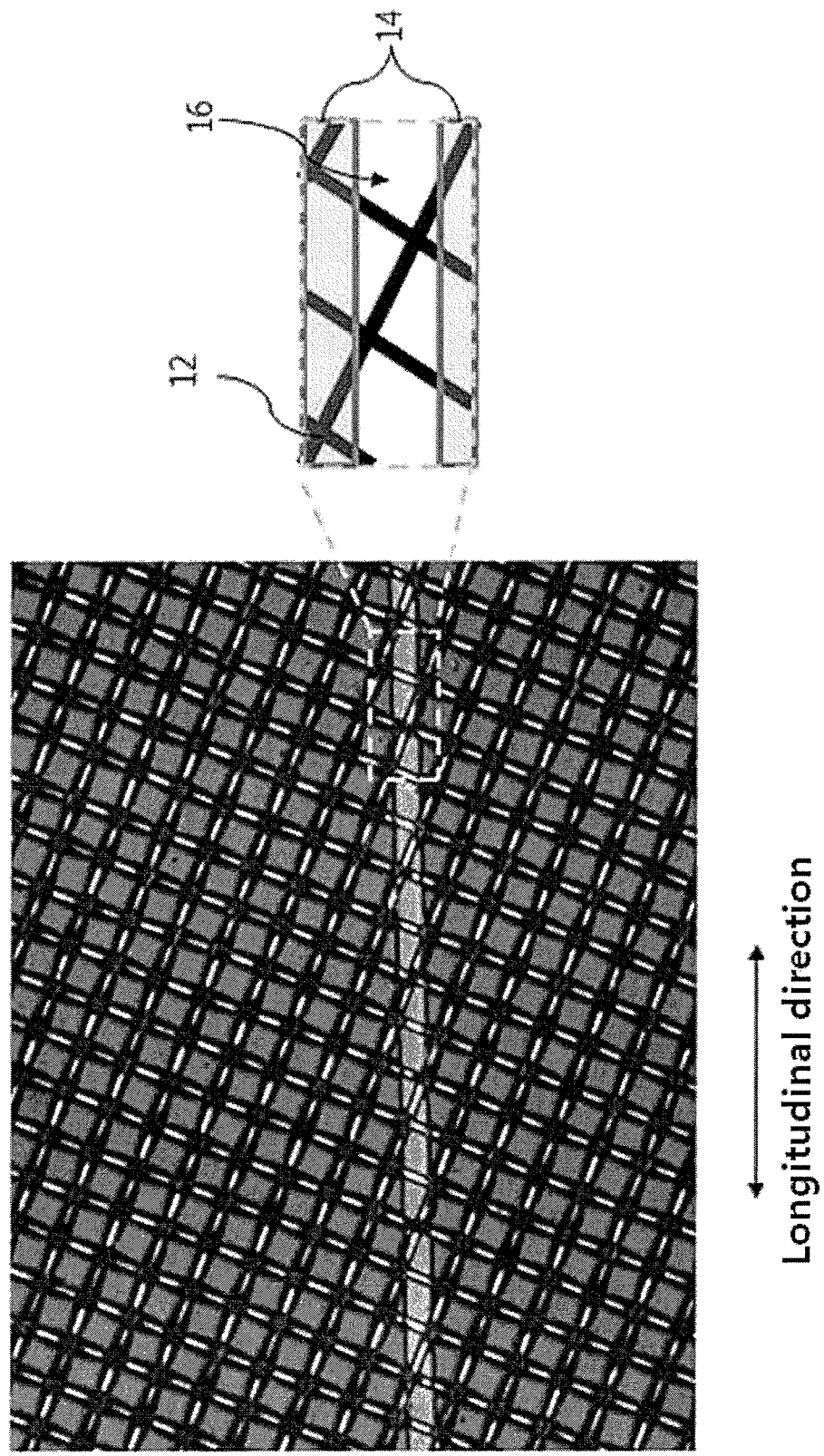
FIG. 1 illustrates a view of a general printing mask used in formation of a finger electrode for solar cells.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. In the drawing figures, the dimensions of layers and regions may be exaggerated for clarity of illustration. Like reference numerals refer to like elements throughout.

As used herein, D50 means a particle diameter at the point where the volume cumulatively measured from smaller particles reaches 50% in a volume-based particle diameter distribution, and D10 means a particle diameter at the point where the volume cumulatively measured from smaller particles reaches 10%.

Hereinafter, embodiments of the present invention will be described in detail.

A method for manufacturing a finger electrode for solar cells according to an example embodiment includes: printing a conductive paste on a front surface of a substrate using a printing mask having an opening rate of about 65% or more; and baking the printed conductive paste.

First, the printing mask according to an example embodiment will be described with reference to FIG. 2.

Figure 2:
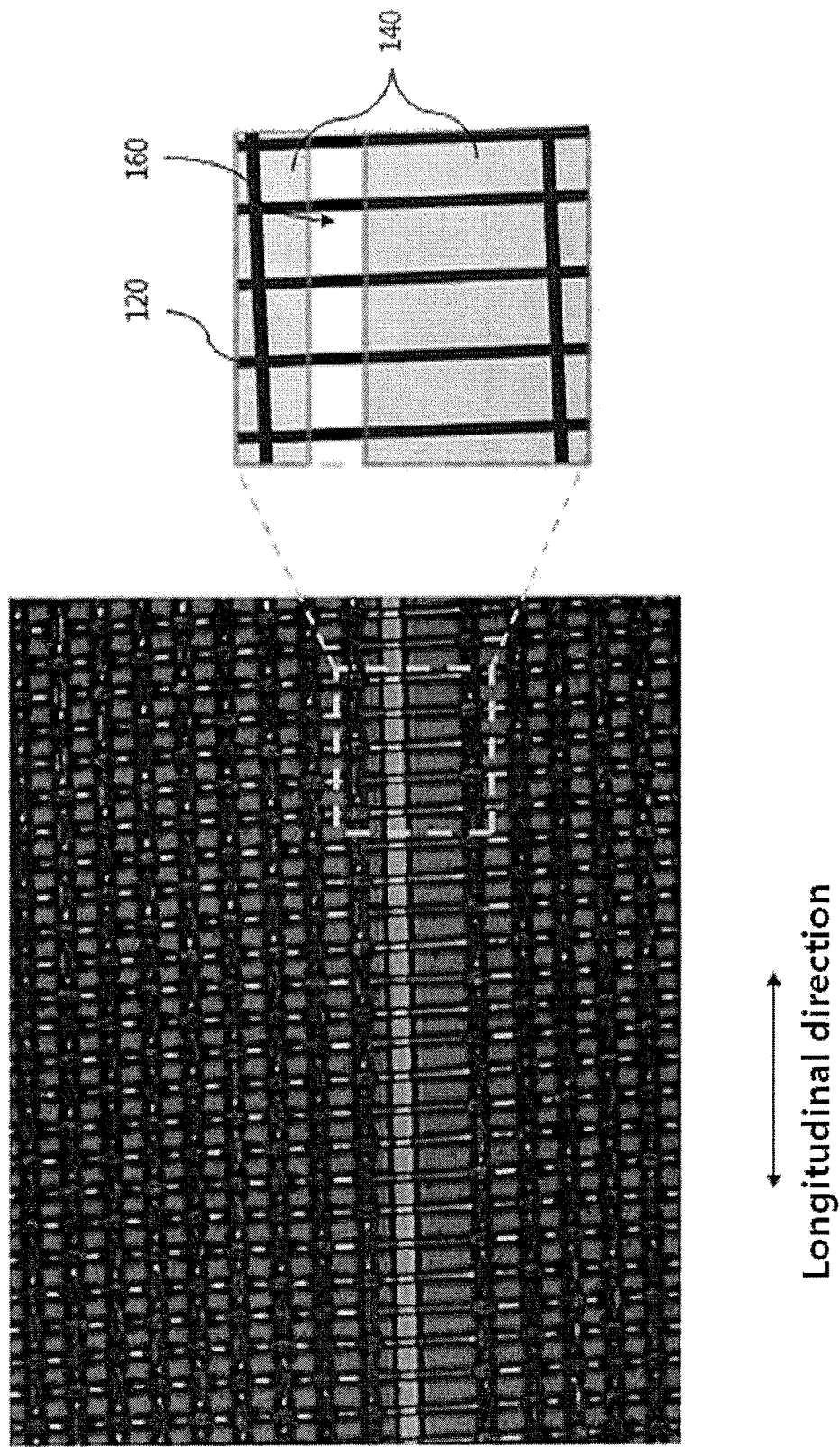
FIG. 2 illustrates a view printing mask having a high opening rate according to an example embodiment.
Figure 3:
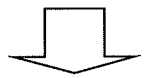
FIG. 3 illustrates a method of manufacturing a finger electrode for a solar cell according to an example embodiment.
Figure 3:
Figure 3:

FIG. 2 shows an example of the printing mask 100 according to an example embodiment. Referring to FIG. 2, the printing mask 100 includes a mesh 120, a photosensitive resin layer 140 integrated with the mesh 120, and an electrode printing portion 160 formed by removing the photosensitive resin layer.

In an example embodiment, the printing mask 100 has an opening rate of about 65% or more, for example, about 65% to about 90%. Here, the opening rate is calculated according to Equation 1:

Opening rate (%)={(Area of electrode printing portion−Area occupied by mesh in electrode printing portion)/Area of electrode printing portion}×100.

Thus, in FIG. 2, the opening rate (%)=100×((area of 160−(area of 120 in the area of 160))/area of 160)

According to the present example embodiment, a finger electrode may be manufactured using the printing mask 100, including the electrode printing portion having a high opening rate, so as to have reduced linewidth. In addition, the method uses a conductive paste that helps prevent spreading after printing or bleeding during baking, which may help improve the aspect ratio of the finger electrode.

In the printing mask 100, warp threads of the mesh may be arranged at an angle of about 80° to about 100°, for example about 85° to about 105°, with respect to the longitudinal direction of the printing portion. When the angle of the warp threads of the mesh falls within this range, the area occupied by the mesh in the electrode printing portion may be minimized, thereby obtaining a high opening rate.

As shown in FIG. 2, the distance between weft threads of the mesh above and below the electrode printing portion 160 may be longer than the distance between weft threads of the mesh in the other region. When the distance between the weft threads of the mesh adjacent the electrode printing portion is relatively long, the area occupied by the mesh in the electrode printing portion 160 may be minimized while preventing reduction in printability due to tension applied to the printing mask by a pressing means during printing of the conductive paste.

Next, the conductive paste used in the present example embodiment will be described. The conductive paste includes a conductive powder, a glass frit, and an organic vehicle.

Conductive Powder

In the present example embodiment, the method employs a conductive paste in which the conductive powder includes a first conductive powder having a particle diameter (D50) of about 0.1 µm to about 1.5 µm and a second conductive powder having a particle diameter (D50) of greater than 1.5 µm to about 5 µm or less. The conductive powder may include two or more types of conductive powders having different particle diameters (D50), which may help improve the aspect ratio and electrical properties of an electrode. The average particle diameter may be measured using, for example, a Model 1064D (CILAS Co., Ltd.) after dispersing the conductive powder in isopropyl alcohol (IPA) at 25° C. for 3 minutes via ultrasonication.

The first conductive powder may have a smaller particle diameter (D50) than the second conductive powder and may have a particle diameter D50 of, for example, about 0.1 µm to about 1.5 µm. The second conductive powder may have a greater particle diameter (D50) than the first conductive powder, and may have a particle diameter D50 of, for example, greater than 1.5 µm to about 5 µm or less. The conductive powder including the first conductive powder and the second conductive powder having different particle diameters may increase the cross-sectional packing density of an electrode pattern, which may help improve electrical properties, patternability, and aspect ratio of the electrode.

A weight ratio of the first conductive powder to the second conductive powder may range from about 1:99 to about 99:1, for example from about 5:95 to about 95:5, for example from about 10:90 to about 90:10. Within this range of weight ratio, the conductive powder may help improve both electrical properties and aspect ratio of the electrode.

The conductive powder as a whole may have a particle diameter (D10) of about 0.5 µm or less, for example. about 0.3 µm or less, for example, about 0.01 µm to about 0.3 µm, for example about 0.1 µm to about 0.2 µm. Within this range of particle diameter (D10), the electrode may have high packing density and can exhibit excellent electrical properties.

The conductive powder may include a general conductive powder suitable for use in solar cell electrodes, such as silver, aluminum, nickel, copper, or a combination thereof, without limitation. Silver powder may be selected in terms of electrical properties.

The conductive powder may have various particle shapes, such as a spherical, flake or amorphous particle shape, without limitation.

The conductive powder may be present in an amount of, for example, about 60 wt % to about 95 wt % based on the total weight of the conductive paste. Within this range, the conductive paste may help improve conversion efficiency of a solar cell and may be easily prepared in paste form. For example, the conductive powder may be present in an amount of about 70 wt % to about 90 wt % based on the total weight of the conductive paste.

Glass Frit

The glass frit may help to form silver crystal grains in an emitter region by etching an anti-reflection layer and melting the conductive powder during a baking process of the electrode paste. Further, the glass frit may help to improve adhesion of the conductive powder to a wafer and may be softened to decrease the baking temperature during the baking process.

When sheet resistance of a solar cell is increased in order to improve solar cell efficiency, there may be an increase in solar cell contact resistance and leakage current. Thus, minimizing both serial resistance (Rs) and influence on a p-n junction while maximizing open circuit voltage is desired. In addition, as the baking temperature may vary within a broad range with increasing use of various wafers having different sheet resistances, it is desirable that the glass frit secure sufficient thermal stability to withstand a wide range of baking temperatures.

The glass frit according to an example embodiment may include at least one of lead (Pb), bismuth (Bi), tellurium (Te), phosphorus (P), germanium (Ge), gallium (Ga), cerium (Ce), iron (Fe), lithium (Li), boron (B), silicon (Si), zinc (Zn), tungsten (W), magnesium (Mg), cesium (Cs), strontium (Sr), molybdenum (Mo), titanium (Ti), tin (Sn), indium (In), vanadium (V), barium (Ba), nickel (Ni), copper (Cu), sodium (Na), potassium (K), arsenic (As), cobalt (Co), zirconium (Zr), manganese (Mn), and aluminum (Al) oxides.

The glass frit may be prepared from such metal oxides by a general method. For example, the metal oxides may be mixed in a predetermined ratio. Mixing may be carried out using, for example, a ball mill or a planetary mill. The mixture may then be melted at, for example, about 900° C. to about 1300° C., which may be followed by quenching to 25° C. The resulting material may be subjected to pulverization using, for example, a disk mill, a planetary mill, or the like, thereby preparing a glass frit.

The glass frit may have an average particle diameter (D50) of, for example, about 0.1 μm to about 10 μm, and may have, for example, a spherical or amorphous shape.

The glass frit may be present in the conductive paste in an amount of, for example, about 0.5 wt % to about 10 wt %, for example, about 1 wt % to about 7 wt %, based on the total weight of the conductive paste. Within this range, the glass flit may help secure stability of a p-n junction under various sheet resistances, minimize serial resistance, and ultimately improve solar cell efficiency.

Organic Vehicle

The organic vehicle may impart suitable viscosity and rheological characteristics for printing to the conductive paste through mechanical mixing with the inorganic component of the paste.

The organic vehicle may be a general organic vehicle suitable for use in a conductive paste for solar cell electrodes and may include a binder resin, a solvent, and the like.

The binder resin may be selected from, for example, acrylate resins, or cellulose resins. Ethyl cellulose may be used as the binder resin. The binder resin may be selected from, for example, among ethyl hydroxyethyl cellulose, nitrocellulose, blends of ethyl cellulose and phenol resins, alkyd resins, phenol resins, acrylic acid ester resins, xylene resins, polybutane resins, polyester resins, urea resins, melamine resins, vinyl acetate resins, wood rosin, polymethacrylates of alcohols, and the like.

The solvent may be selected from the group of, for example, hexane, toluene, ethyl cellosolve, cyclohexanone, butyl cellosolve, butyl carbitol (diethylene glycol monobutyl ether), dibutyl carbitol (diethylene glycol dibutyl ether), butyl carbitol acetate (diethylene glycol monobutyl ether acetate), propylene glycol monomethyl ether, hexylene glycol, terpineol, methylethylketone, benzylalcohol, y-butyrolactone, and ethyl lactate. These may be used alone or as a mixture thereof.

The organic vehicle may be present in an amount of, for example, about 1 wt % to about 30 wt % based on the total weight of the conductive paste. Within this range, the organic vehicle may provide sufficient adhesive strength and excellent printability to the composition.

Additives

The conductive paste may further include additives, for example, to enhance fluidity and process properties and stability. The additives may include, for example, dispersants, thixotropic agents, plasticizers, viscosity stabilizers, anti-foaming agents, pigments, UV stabilizers, antioxidants, coupling agents, and the like. These additives may be used alone or as mixtures thereof. The additives may be present in an amount of, for example, about 0.1 wt % to about 5 wt % based on the total weight of the conductive paste.

According to the present example embodiment, printing the conductive paste may be performed through a procedure in which, after the printing mask having an opening rate of about 65% or more is disposed on the front surface of the substrate and the conductive paste is disposed on the printing mask, a pressing means such as a squeegee or a roller is moved on the conductive paste such that the conductive paste is printed on the front surface of the substrate through openings of the printing mask.

Then, the conductive paste may be subjected to drying, for example, at about 150° C. to about 400° C., for example about 200° C. to about 400° C. Here, drying may be performed in an IR drying furnace or the like. In addition, drying may be performed for, for example, 10 to 120 seconds.

Then, the printed conductive paste may be subjected to baking, thereby forming a finger electrode. Baking may be performed at, for example, about 600° C. to about 1000° C. for, for example, about 10 to about 120 seconds.

Finger Electrode for Solar Cells

A finger electrode for solar cells according to an example embodiment may be manufactured by the method of manufacturing a finger electrode for solar cells according to an example embodiment.

The finger electrode for solar cells may have a small linewidth of, for example, about 50 μm or less, for example about 20 μm to about 50 μm, for example about 20 μm to about 48 μm, and thus may maximize a light receiving area, thereby realizing excellent conversion efficiency of a solar cell.

The finger electrode for solar cells may have an aspect ratio of, for example, about 0.32 or greater, for example, about 0.32 to about 0.8, for example about 0.35 to about 0.7, for example about 0.37 to about 0.6. Within this range of aspect ratio, the electrode may exhibit good electrical properties while having fine linewidth.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

In addition, descriptions of details apparent to those skilled in the art may be omitted for clarity.

Preparative Example

Details of components used in the following Preparative Examples are as follows:

(A) Conductive Powder

Conductive powder I: Spherical silver (Ag) powder having a particle diameter (D50) of 0.5 μm (1-31C, Dowa Hightech Co., Ltd.)

Conductive powder II: Spherical silver (Ag) powder having a particle diameter (D50) of 2.5 μm (874, TECHNIC Inc.)

Conductive powder III: Spherical silver (Ag) powder having a particle diameter (D50) of 3.5 μm (6-11F, Dowa Hightech Co., Ltd.)

Conductive powder IV: Spherical silver (Ag) powder having a particle diameter (D50) of 5.5 μm (G35, Dowa Hightech Co., Ltd.)

Conductive powder V: Spherical silver (Ag) powder having a particle diameter (D50) of 0.08 μm (TWA02, Dowa Hightech Co., Ltd.)

(B) Glass frit: Bismuth-tellurium-oxide (Bi—Te—O)-based glass frit (ABT-1, Asahi Glass Co., Ltd.)

(C) Organic binder: Ethylcellulose (STD4, Dow Chemical Company)

(D) Solvent: Texanol (Eastman Chemical Company)

(E) Dispersant: TEGO® Dispers 656 (Evonik Industries)

(F) Thixotropic agent: Thixatrol ST (Elementis Co., Ltd.)

Preparative Examples 1 to 9

The aforementioned components were mixed with one another in amounts as listed in Table 1, thereby preparing a conductive paste. For example, (C) an organic binder was sufficiently dissolved in (D) a solvent at 60° C. to prepare an organic vehicle, and a conductive powder, glass frits, a dispersant, and a thixotropic agent were added to the organic vehicle, followed by mixing and kneading in a 3-roll kneader, thereby preparing a conductive paste.

TABLE 1

| Unit: Parts by weight | | 1 | 2 | 3 | 4 | 5 | 6 | 7 | 8 | 9 |
|---|---|---|---|---|---|---|---|---|---|---|
| Conductive powder | I | 5 | 85 | 45 | 85 | 90 | — | 2 | 70 | — |
| | II | 85 | 5 | 45 | — | — | 90 | 88 | — | 85 |
| | III | — | — | — | 5 | — | — | — | — | — |
| | IV | — | — | — | — | — | — | — | 20 | — |
| | V | — | — | — | — | — | — | — | — | 5 |
| Particle diameter D10 (μm) | | 0.5 | 0.2 | 0.375 | 0.425 | 0.125 | 0.625 | 0.6 | 0.55 | 0.6 |
| Glass frit | | 2.5 | 2.5 | 2.5 | 2.5 | 2.5 | 2.5 | 2.5 | 2.5 | 2.5 |
| Organic vehicle | Binder | 0.5 | 0.5 | 0.5 | 0.5 | 0.5 | 0.5 | 0.5 | 0.5 | 0.5 |
| | Solvent | 6 | 6 | 6 | 6 | 6 | 6 | 6 | 6 | 6 |
| Dispersant | | 0.5 | 0.5 | 0.5 | 0.5 | 0.5 | 0.5 | 0.5 | 0.5 | 0.5 |
| Thixotropic agent | | 0.5 | 0.5 | 0.5 | 0.5 | 0.5 | 0.5 | 0.5 | 0.5 | 0.5 |
| Total | | 100 | 100 | 100 | 100 | 100 | 100 | 100 | 100 | 100 |

In Table 1, the particle diameter (D10) means a particle diameter (D10) of the conductive powder as a whole and was measured using a Model 1064D (CILAS Co., Ltd.) after dispersing the conductive powder in isopropyl alcohol (IPA) at 25° C. for 3 minutes via ultrasonication.

Example 1

A printing mask having an opening rate of 82% and including an electrode printing portion having a linewidth of 26 μm (Samlip Precision Ind.) was placed on a semiconductor substrate, and the conductive paste prepared in Preparative Example 1 was placed on the printing mask and then printed using a squeegee, followed by drying in an IR drying furnace. Then, an aluminum paste was printed on a back surface of the semiconductor substrate and dried in the same manner as above. Cells formed according to this procedure were subjected to baking at 950° C. for 45 seconds in a belt-type baking furnace, thereby fabricating a solar cell.

Example 2

A solar cell was prepared in the same manner as in Example 1 except that the conductive paste prepared in Preparative example 2 was used.

Example 3

A solar cell was prepared in the same manner as in Example 1 except that the conductive paste prepared in Preparative example 3 was used.

Example 4

A solar cell was prepared in the same manner as in Example 1 except that the conductive paste prepared in Preparative example 4 was used.

Comparative Example 1

A solar cell was prepared in the same manner as in Example 1 except that the conductive paste prepared in Preparative example 5 was used.

Comparative Example 2

A solar cell was prepared in the same manner as in Example 1 except that the conductive paste prepared in Preparative example 6 was used.

Comparative Example 3

A solar cell was prepared in the same manner as in Example 1 except that the conductive paste prepared in Preparative example 7 was used.

Comparative Example 4

A solar cell was prepared in the same manner as in Example 1 except that the conductive paste prepared in Preparative example 8 was used.

Comparative Example 5

A solar cell was prepared in the same manner as in Example 1 except that the conductive paste prepared in Preparative example 9 was used.

Comparative Example 6

A solar cell was prepared in the same manner as in Example 1 except that a printing mask having an opening rate of 63% and including an electrode printing portion having a linewidth of 26 μm (Lebon Screen Printing Equipment) was used.

Property Evaluation (1) Linewidth: Electrode linewidth was measured using a confocal microscope (VK-9700, Keyence Corp.).

(2) Electrical properties: Each of the solar cells prepared in Examples 1 to 4 and Comparative Examples 1 to 6 was evaluated as to short circuit current (Isc), open-circuit voltage (Voc), contact resistance (Rs), fill Factor (FF, %), and conversion efficiency (Eff.) using a solar cell efficiency tester (CT-801, Pasan Co., Ltd.). Results are shown in Table 2.

TABLE 2

| Item | Aspect ratio | Linewidth (μm) | Thickness (μm) | Linewidth resolution | Isc (A) | Voc (mV) | Rs (mΩ) | Eff. (%) |
|---|---|---|---|---|---|---|---|---|
| Example 1 | 0.51 | 38 | 19.5 | 25 | 8.92 | 636 | 1.3 | 18.67 |
| Example 2 | 0.45 | 41 | 18.5 | 25 | 8.89 | 635.2 | 1.5 | 18.65 |

TABLE 2-continued

| Item | Aspect ratio | Linewidth (μm) | Thickness (μm) | Linewidth resolution | Isc (A) | Voc (mV) | Rs (mΩ) | Eff. (%) |
|---|---|---|---|---|---|---|---|---|
| Example 3 | 0.48 | 40 | 19.2 | 25 | 8.9 | 636.3 | 1.4 | 18.62 |
| Example 4 | 0.40 | 47 | 18.9 | 25 | 8.8 | 635.1 | 1.6 | 18.65 |
| Comparative Example 1 | 0.28 | 57 | 15.7 | 35 | 8.72 | 634.3 | 2.5 | 17.98 |
| Comparative Example 2 | 0.26 | 62 | 15.9 | 35 | 8.7 | 635.1 | 2.3 | 18.12 |
| Comparative Example 3 | 0.28 | 58 | 16.1 | 35 | 8.72 | 635 | 2.3 | 18.00 |
| Comparative Example 4 | 0.29 | 55 | 16 | 40 | 8.7 | 635.2 | 2.2 | 18.12 |
| Comparative Example 5 | 0.27 | 58 | 15.8 | 35 | 8.65 | 634 | 2.9 | 17.80 |
| Comparative Example 6 | 0.26 | 59 | 15.5 | 40 | 8.63 | 633.5 | 3.2 | 17.60 |

As shown in Table 2, it may be seen that the solar cell electrodes of Examples 1 to 4 each prepared using a printing mask having an opening rate according to an example embodiment and a conductive paste including a conductive powder combination according to an example embodiment were excellent in both aspect ratio and electrical properties.

Conversely, it may be seen that the solar cell electrodes of Comparative Examples 1 to 5 prepared using a conductive paste not including the first conductive powder or the second conductive powder or using a conductive powder which had a particle size (D10) of greater than 0.5 μm, exhibited poor properties in terms of both aspect ratio and electrical properties. In addition, it may be seen that the solar cell electrode of Comparative Example 6 prepared using a printing mask having a low opening rate exhibited relatively poor properties in terms of all properties, as compared with those of Examples.

By way of summation and review, a solar cell electrode may be manufactured by placing a printing mask having openings for formation of electrodes on a semiconductor substrate, placing a conductive paste on the printing mask, and printing the conductive paste on the semiconductor substrate through the openings of the printing mask in the form of electrodes, followed by baking the printed conductive paste.

FIG. 1 shows an image of a general printing mask for formation of a solar cell electrode. Referring to FIG. 1, the general printing mask may be manufactured by applying a photosensitive resin 14 to a mesh 12 arranged obliquely with respect to the longitudinal direction of the printing mask and selectively removing a portion of the photosensitive resin at which an electrode will be printed using a photoresist process, thereby forming an electrode printing portion 16. The general printing mask for formation of solar cell electrodes may have an opening rate of 45% to 60%, wherein the opening rate refers to the proportion of the area occupied by a mesh-free portion to the total area of the electrode printing portion.

A finger electrode formed on a front surface of a solar cell may have a small linewidth. The finger electrode may be is narrow and large in height so as to increase a sunlight receiving area. If a printing mask having an opening rate of 45% to 60% is used, there may be a limit in increasing the electrode aspect ratio (height/linewidth), and improvement in solar cell conversion efficiency may thus be limited.

It is desired to improve the aspect ratio of a finger electrode using a printing mask having an opening rate of 65% or more. However, if a conductive paste composition suitable for use with a general printing mask having a low opening rate is applied to a printing mask having a high opening rate, linewidth may be increased during baking, causing little or no enhancement in aspect ratio, and/or resulting deterioration in electrical properties.

As described above, embodiments may provide a method of manufacturing a finger electrode for solar cells having high aspect ratio and excellent electrical properties and a finger electrode for solar cells manufactured by the same.

LIST OF REFERENCE NUMERALS 10, 100: Printing mask
12, 120: Mesh
14, 140: Photosensitive resin
16, 160: Electrode printing portion Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise for example indicated. Accordingly, it will be understood by those of skill in the art that various changes in form and details may be made without departing from the spirit and scope of the present invention as set forth in the following claims.

What is claimed is:

1. A method of manufacturing a finger electrode for a solar cell, the method comprising:
   printing a conductive paste on a front surface of a substrate using a printing mask having an opening rate of 65% or more; and
   baking the printed conductive paste,
   wherein the conductive paste includes a conductive powder, a glass frit, and an organic vehicle, and
   wherein the conductive powder includes a first conductive powder having a particle diameter (D50) of about 0.1 μm to about 1.5 μm and a second conductive powder having a particle diameter (D50) of greater than 1.5 μm to about 5 μm, and the conductive powder as a whole has a particle diameter (D10) of about 0.5 μm or less.

2. The method as claimed in claim 1, wherein the conductive powder as a whole has a particle diameter (D10) of about 0.1 μm to about 0.2 μm.

3. The method as claimed in claim 1, wherein a weight ratio of the first conductive powder to the second conductive powder ranges from about 1:99 to about 99:1.

4. The method as claimed in claim 1, wherein the printing mask has an opening rate of about 65% to about 90%.

5. The method as claimed in claim 1, wherein the printing mask includes a mesh, a photosensitive resin layer integrated with the mesh, and an electrode printing portion formed by removing the photosensitive resin layer.

6. The method as claimed in claim 1, wherein baking of the conductive paste is performed at about 600° C. to about 1,000° C.

7. The method as claimed in claim 1, wherein the glass frit includes at least one of lead (Pb), bismuth (Bi), tellurium (Te), phosphorus (P), germanium (Ge), gallium (Ga), cerium (Ce), iron (Fe), lithium (Li), boron (B), silicon (Si), zinc (Zn), tungsten (W), magnesium (Mg), cesium (Cs), strontium (Sr), molybdenum (Mo), titanium (Ti), tin (Sn), indium (In), vanadium (V), barium (Ba), nickel (Ni), copper (Cu), sodium (Na), potassium (K), arsenic (As), cobalt (Co), zirconium (Zr), manganese (Mn), and aluminum (Al) oxides.

8. The method as claimed in claim 1, wherein the conductive paste includes about 60 wt % to about 95 wt % of the conductive powder, about 0.5 wt % to about 20 wt % of the glass frit, and about 1 wt % to about 30 wt % of the organic vehicle.

9. The method as claimed in claim 1, wherein the conductive paste further includes: at least one additive of a dispersant, a thixotropic agent, a plasticizer, a viscosity stabilizer, an anti-foaming agent, a pigment, a UV stabilizer, an antioxidant, and a coupling agent.

10. A finger electrode for a solar cell manufactured by the method as claimed in claim 1.

11. A solar cell comprising a finger electrode manufactured by the method as claimed in claim 1.

12. The method as claimed in claim 1, wherein:
the first conductive powder is silver, aluminum, nickel, copper, or a combination thereof, and
the second conductive powder is silver, aluminum, nickel, copper, or a combination thereof.

13. The method as claimed in claim 1, wherein the first conductive powder and the second conductive powder are a same metal.

* * * * *